United States Patent
Ho et al.

(10) Patent No.: US 7,468,912 B2
(45) Date of Patent: Dec. 23, 2008

(54) MULTI-LEVEL-CELL PROGRAMMING METHODS OF NON-VOLATILE MEMORIES

(75) Inventors: Wen Chiao Ho, Tainan (TW); Chin Hung Chang, Tainan (TW); Kuen Long Chang, Taipei (TW); Chun Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 20 days.

(21) Appl. No.: 11/624,612

(22) Filed: Jan. 18, 2007

(65) Prior Publication Data

US 2007/0121386 A1   May 31, 2007

Related U.S. Application Data

(63) Continuation of application No. 11/281,181, filed on Nov. 17, 2005, now Pat. No. 7,180,780.

(51) Int. Cl.
   *G11C 11/34* (2006.01)
(52) U.S. Cl. ............................... 365/185.18; 365/185.2
(58) Field of Classification Search ............ 365/185.18, 365/185.2, 201
   See application file for complete search history.

(56) References Cited

U.S. PATENT DOCUMENTS

| | | | |
|---|---|---|---|
| 6,011,725 A | 1/2000 | Eitan | |
| 6,366,496 B1 | 4/2002 | Torelli et al. | |
| 6,538,923 B1 | 3/2003 | Parker | |
| 6,714,457 B1 | 3/2004 | Hsu et al. | |
| 6,778,442 B1 * | 8/2004 | Hamilton et al. | 365/185.28 |
| 6,829,171 B2 * | 12/2004 | Ooishi | 365/185.21 |
| 6,888,758 B1 * | 5/2005 | Hemink et al. | 365/185.22 |
| 6,937,520 B2 * | 8/2005 | Ono et al. | 365/185.18 |
| 7,110,300 B2 | 9/2006 | Visconti | |

* cited by examiner

*Primary Examiner*—Son Dinh
(74) *Attorney, Agent, or Firm*—Kenta Suzue; Haynes Beffel & Wolfeld LLP

(57) ABSTRACT

The present invention provides a novel method in altering the sequence of multi-level-cell programming in a multi-bit-cell of a nitride trapping memory cell that reduces or eliminates voltage threshold shifts between program steps while avoiding the suppression in the duration of a read window caused by a complementary bit disturbance. In a first embodiment, the present invention programs the multi-level cell in a multi-bit-cell having four bits in the following order: programming a third program level (level3), programming a first program level (level1) and a second program level (level2) to level 1, and programming the second program level from the first program level. In a second embodiment, the present invention programs the multi-level cell in the multi-bit-cell having four bits in the following order: programming a third program level (level3), programming a second program level (level2), and programming a first program level (level1).

18 Claims, 10 Drawing Sheets

MULTI-LEVEL-CELL PROGRAMMING METHODS OF NON-VOLATILE MEMORIES

RELATED APPLICATIONS

This application is a continuation of U.S. patent application Ser. No. 11/281,181, filed 17 Nov. 2005, by inventors Wen-Chiao Ho, Chin-Hung Chang, Kuen-Long Chang and Chun-Hsiung Hung entitled Multi-Level-Cell Programming Methods of Non-Volatile Memories, owned by the assignee of this application and incorporated by reference as if fully set forth herein.

BACKGROUND OF THE INVENTION

1. Field of the Invention

The present invention relates generally to electronic data storage devices, and more particularly, to non-volatile multi-level-cell (MLC) semiconductor memory devices and a method for maintaining read window duration in a series of programming processes of a multi-level-cell in a multi-bit-cell (MBC).

2. Description of Related Art

Electrically programmable and erasable non-volatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a non-volatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising in memory cell structures based on charge trapping dielectric layers, because of the scalability and simplicity of the manufacturing processes. Memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

As shown in FIG. 1, there is a flow diagram illustrating a conventional multi-level-cell program method 100 that sequentially programs a nitride trapping memory cell having four bits. The method 100 is used to program the nitride trapping memory cell sequentially, starting with a level1 programming 110, follow by a level2 programming 120, and followed by a level3 programming 130. A subsequent programming of the nitride trapping memory cell is likely to cause a complementary bit disturbance (or second bit effect), which in turn reduces the width of a read window due to a high boundary shift. This shortcoming will be further described below with respect to FIG. 2.

In FIG. 2, there is a graphical diagram 200 illustrating the sequential programming of different threshold voltage levels in the nitride trapping memory cell. The graph 200 is initially at a level0 210 after an erase. In step 1, the level1 program 220 is performed, which shows a threshold voltage distribution 225. In step 2, a level2 program 230 is performed, which shows a threshold voltage distribution 235. In step 3, a level3 program 240 is performed, which shows a threshold voltage distribution 245. Each program sequence causes a high boundary shift of lower Vt level. After the level2 program 230, there is a shift to the right in the high boundary of lower Vt level as shown in 225-2. A symbol $\Delta Vt1$ 227 denotes the amount of the high boundary shift on the lower Vt level in the level1 program 220. After the level3 program 240, there is a shift to the right in the high boundary of lower Vt level in the level1 program as shown in 225-3 and there is a shift to the right in the high boundary of lower Vt level in the level2 program as shown in 235-2. A symbol $\Delta Vt2$ 237 denotes the amount of the high boundary shift on the lower Vt level in level2 program 230.

With the higher level of Vt, the larger window loss occurs due to the complementary bit disturbance. As a result, the highest boundary, H region 247, dominates the amount of Vt shifts ($\Delta Vt0$, $\Delta Vt1$, and $\Delta Vt2$). The read speed is slow due to the sequence in which every level program starts from an erased Vt region.

Accordingly, it is desirable to have a multi-level-cell program method that reduces or eliminates the high boundary shift of lower Vt level in one or more nitride trapping memory cells in a memory array.

SUMMARY OF THE INVENTION

The present invention provides a novel method for altering the sequence of multi-level-cell programming in a multi-bit-cell of a nitride trapping memory cell that reduces or eliminates voltage threshold shifts between programming steps while avoiding the suppression in the duration of a read window caused by a complementary bit disturbance. One suitable implementation of the nitride trapping material memory cell of the present invention is a SONOS cell. In a first embodiment, the present invention is used to program the multi-level cell in a multi-bit-cell having four bits in the following order: programming a third program level (level3), programming a first program level (level1) and a second program level (level2) to level 1, and programming the second program level from the first program level. In a second embodiment, the present invention is used to program the multi-level cell in the multi-bit-cell having four bits in the following order: programming a third program level (level3), programming a second program level (level2), and programming a first program level (level 1).

Broadly stated, a method for programming a multi-level-cell in a multi-bit-cell of a charge trapping memory cell having a first side and a second side, the first side of the charge trapping memory cell storing a first bit and a third bit, the second side of the charge trapping memory cell storing a second bit and a fourth bit, the first bit associated with a first voltage level and the second bit associated with a second voltage level, comprises performing a high level programming in the charge trapping memory cell; program verifying whether the charge trapping memory cell has been programmed to the high level passes a high threshold voltage level; and if the charge trapping memory cell passes the high threshold voltage level, performing a low programming level in the charge trapping memory cell.

Advantageously, the present invention produces a faster program speed due to the mutual effect of the complementary bit status. The present invention also advantageously suppresses the read window loss due to the complementary bit disturbance.

The structures and methods of the present invention are disclosed in the detailed description below. This summary does not purport to define the invention. The invention is defined by the claims. These and other embodiments, features, aspects, and advantages of the invention will become better understood with regard to the following description, appended claims and accompanying drawings.

DETAILED DESCRIPTION OF EMBODIMENTS OF THE INVENTION

Figure 3A:
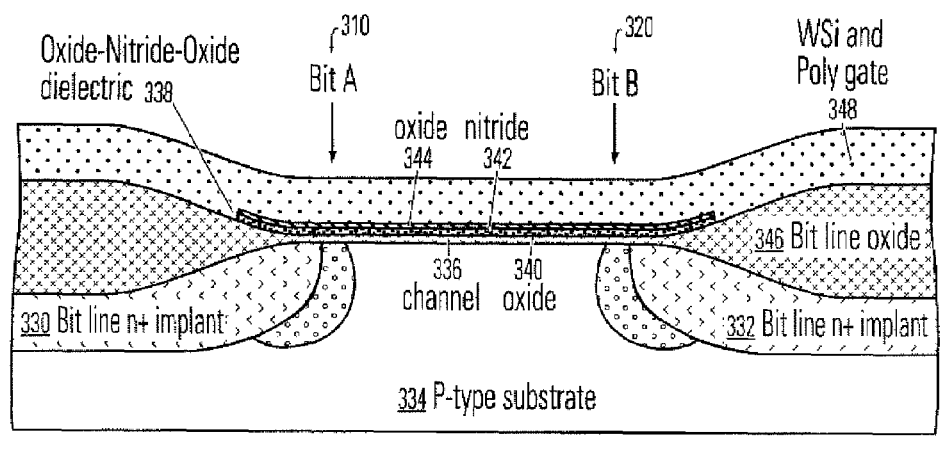
FIG. 3A is a structural diagram illustrating a cross-section of a multi-bit-cell in a nitride trapping memory device with two bits in accordance with the present invention.

Referring now to FIG. 3A, there is shown a structural diagram illustrating a cross-section of a multi-bit-cell (MBC) in a nitride trapping memory device 300 with two bits. A first bit, bit A 310, is positioned on the left side of the nitride trapping memory device 300, while a second bit, bit B 320, is positioned on the right side of the nitride trapping memory device 300. The nitride storage cell structure 300 is manufactured with the bit line n+ implant 330 and a bit line n+ implant 332 on a p-type substrate 334. A channel 336 extends from a right edge of the bit line no implant 330 to the left edge of the bit line n+ implant 332. An oxide-nitride-oxide dielectric 338 has a bottom silicon dioxide layer 340, which is overlaid by a silicon nitride layer 342, which is overlaid by an upper silicon dioxide layer 344. A tungsten silicide (WSi2) and poly gate 348 overlays the top silicon dioxide layer 344. A bit line oxide 346 is disposed between the bit line n+ implant 332 and the WSi and poly gate 348.

Figure 3B:
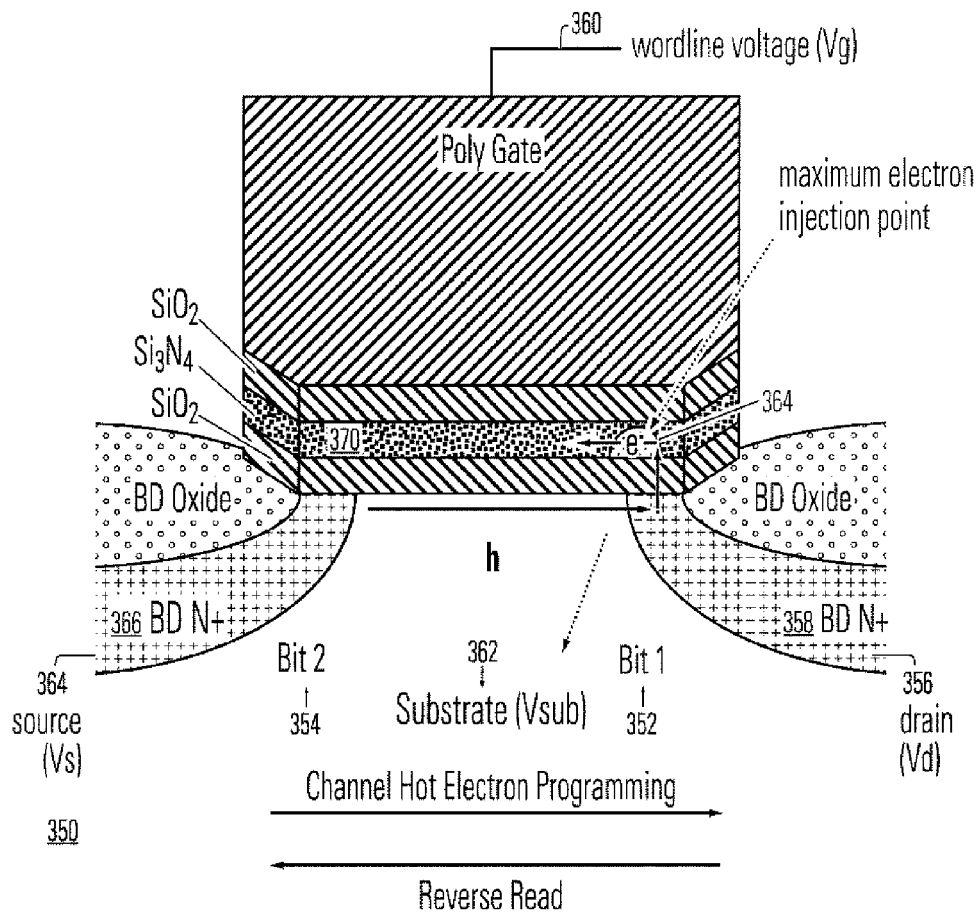
FIG. 3B is a simplified process diagram illustrating a cross-section of a nitride storage cell in program mode using channel hot electron programming in accordance with the present invention.

In FIG. 3B, there is shown a simplified process diagram 350 illustrating a cross-section of a nitride storage cell in programming mode using channel hot electron programming. When programming bit 1 352, the drain region 356 is defined on the right side connected to the barrier diffusion N+ (BD N+) 358, and the source region 364 is defined on the left side connected to a barrier diffusion N+ 366. On the other side, the barrier diffusion N+ 366 is connected to the source region 364 that functions as virtual ground Vs. The identification and operation of a drain region and a source region is interchangeable with the use of a virtual ground Vs such that the drain region is on the right side and the source region is on the left side when programming bit 1, and such that the drain region is on the left side and the source region is on the right side when programming bit 2. Electrons 364 are stored in a nitride layer ($Si_3N_4$) 370 during programming.

Figure 4:
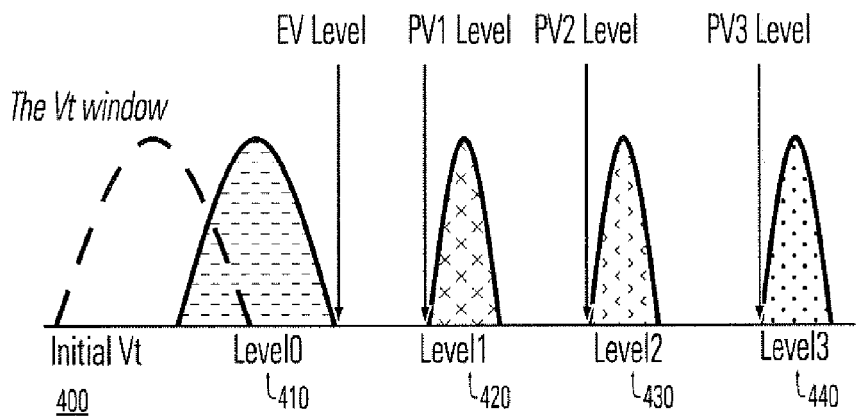
FIG. 4 is a graphical diagram illustrating different program voltage levels of the multi-level-cell in a multi-bit-cell in accordance with the present invention.

As a technique to increase the density of the nitride trapping memory device 300 within the confines of a memory cell area, a graph 400 in FIG. 4 is shows a multi-level-cell for increasing the total number of bits from two bits to four bits with an electrical method by separating the level of threshold voltages. In one MLC implementation, the program levels (or threshold voltage levels) in a first program level (level0) 410, a second program level (level1) 420, a third program level (level2) 430, and a fourth program level (level3) 440 are represented respectively in binary formats as 11, 01, 10, and 00. In another MLC implementation, the program voltage levels are represented in binary formats as 11, 01, 00, and 10. In a further MLC implementation, the program voltage levels are represented in binary formats as 11, 10, 00, and 01. One of ordinary skill in the art should recognize that the threshold voltage level definitions are not limited to these three examples, but other threshold voltage level definitions can be practiced without departing from the spirit of the present invention.

Figure 5:
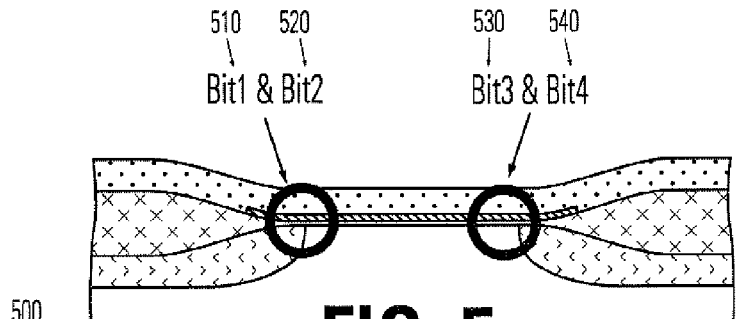
FIG. 5 is a structural diagram illustrating a multi-level-cell in a multi-bit-cell nitride trapping material in accordance with the present invention.

To build a multi-level-cell in a multi-bit-cell nitride memory cell, each bit on the left side and the right side in the nitride trapping memory cell 500 in FIG. 5 has two Vt levels so that the nitride trapping memory cell 500 effectively contains four bits. The left side of the nitride trapping memory cell 500 contains bit 1 510 and bit 2 520, while the right side of the nitride trapping memory cell 500 contains bit 3 530 and bit 4 540. In other words, the nitride trapping memory cell 500 has two bits, bit 1 510 and bit 2 520, on the left side, and two bits, bit 3 530 and bit 4 540, on the right side. One of ordinary skill in the art should recognize that additional Vt levels can be applied to each bit in the nitride trapping memory cell 500 in order to produce 8, 16, or more bits for each nitride trapping memory cell 500.

Figure 6:
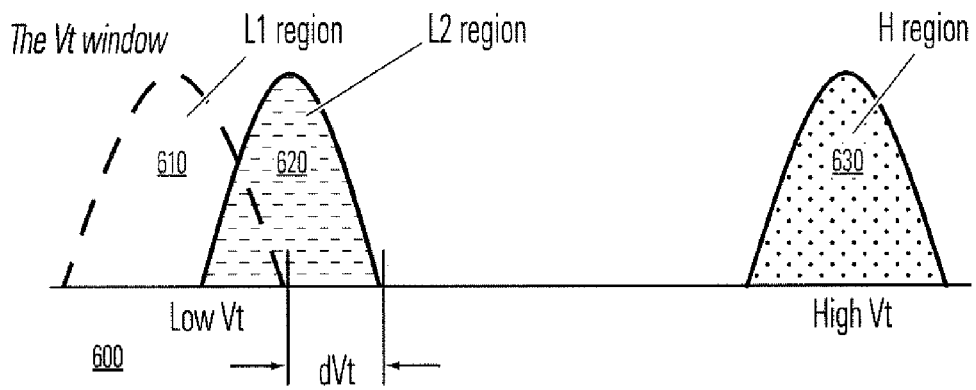
FIG. 6 is a graphical diagram illustrating a complementary bit disturbance in the multi-level-cell in accordance with the present invention.

FIG. 6 is a graphical diagram 600 illustrating complementary bit disturbance (or second bit effect) between the left side and the right side of the nitride trapping memory cell 500. Due to the interaction between one of the two bits (bit 1 510 or bit 2 520) on the left side and the one of the two bits (bit 3 530 or bit 4 540) in the nitride trapping memory cell 500, the threshold voltage will be affected according to the complementary bit status. In the multi-bit-cell nitride trapping memory cell 500, one of the two bits on the left side, bit 1 510 or bit 2 520, and one of the two bits on the right side, bit 3 530 or bit 4 540, fall in L1 region 610, i.e. low Vt region. In one example, let us assume that bit 1 510 and bit 3 530 fall in the L1 region 610. The threshold voltage, Vt, bit 1 510 will rise to L2 region 620 if bit 3 530 is programmed to the high Vt level H region 630, even if the bit 1 510 is not programmed. The shift in a voltage threshold Vt, ΔVt, refers to a complementary bit disturbance. The complementary bit disturbance results in similar programming behavior for the complementary lower Vt (or erased Vt) bit. A margin Vt refers to a threshold voltage status, i.e., the minimum voltage that is applied to a word line so that a memory cell can be read as erased relative to a corresponding reference current.

Two overriding considerations in programming a multi-level-cell are the program speed and the read window. The complementary bit disturbance is relevant as a factor to improve the program speed of a nitride trapping memory cell. Another factor that affects the program speed of the nitride trapping memory cell is a neighboring bit having a high threshold voltage Vt. For example, the program speed of the bit 3 530 is likely to be faster if bit 1 510 has a high threshold voltage Vt status.

Figure 7:
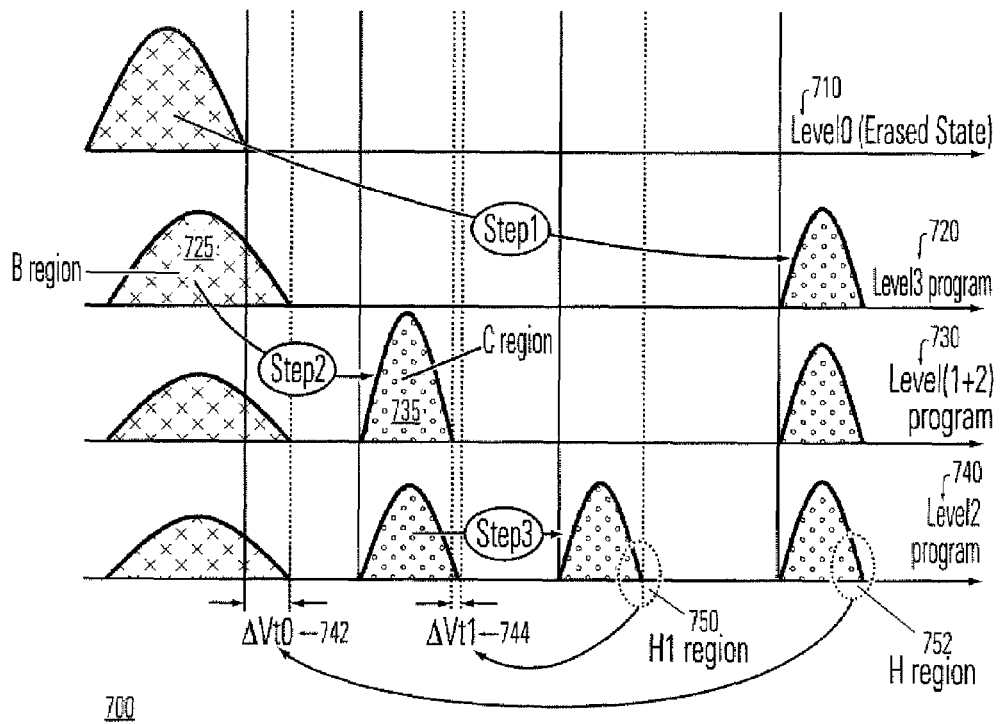
FIG. 7 is a graphical diagram illustrating a first method of enhancing the multi-level-cell program speed while suppressing the read window loss due to complementary bit disturbance in accordance with the present invention.

FIG. 7 is a graphical diagram 700 illustrating a first method for enhancing the multi-level-cell program speed while suppressing the read window loss due to complementary bit disturbance. The graphical diagram 700 shows that the programming is performed in the following sequence: (1) program level3, (2) program level1, and level2 to level1, and (3) program level2 from level1. Initially, the nitride trapping memory cell 500 is erased while operating at level0 710. Rather than starting programming at level1, at step 1, the nitride trapping memory cell 500 is programmed to 30 level3 720. At step 2 in 730, the nitride trapping memory cell 500 is programmed to level1 as well as program level2 to level1. At step 3 in 740, the nitride trapping memory cell 500 is programmed to level2 from level1

The programming speed of the level1 bit is enhanced in the first method on two bases. First, in the programming sequence in the first method, the program speed will be faster if the neighboring bit is at level3 and has a high Vt. In other words, if the bit 1 510 (left side) has high Vt status, then the programming of bit 3 530 (right side) will be faster. Secondly, the complementary bit disturbance produced by level3 programming where the initial point of some bits is not from the erased state but rather the initial point of some bits from B region 725 in FIG. 7, instead of from A region 215 in FIG. 2, which translates to a higher Vt region. In other words, the complementary bit disturbance is used to assist in the programming process.

The programming speed of the level2 bit is enhanced in the first method on two bases. First, in the programming sequence in the first method, the programming speed will be faster if the neighboring bit is either at level3 or at level1, which both have high Vt. In other words, if the bit 1 510 (left side) has a high Vt status, then the programming of bit 3 530 (right side) will be faster. Secondly, given that the programming of the level2 bit is also performed during the level1 programming phase, the initial point of some bits during final level2 programming phase begins at comes at a C region 735 in FIG. 7, rather than at an A region 215 in FIG. 6.

Figure 1:
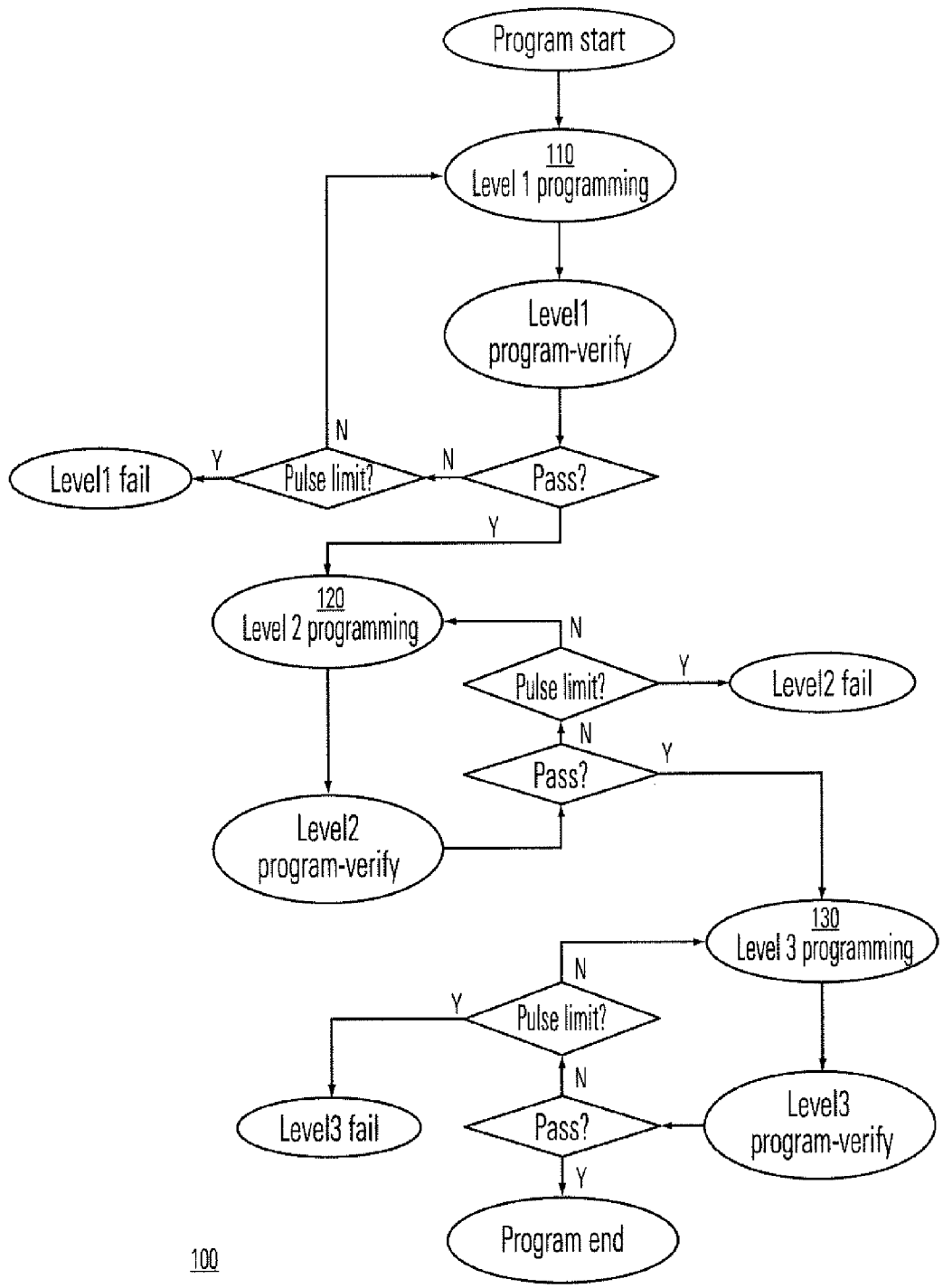
FIG. 1 is a flow diagram illustrating a conventional multi-bit-cell programming method that programs sequentially a nitride trapping memory cell having four bits in accordance with the present invention.
Figure 2:
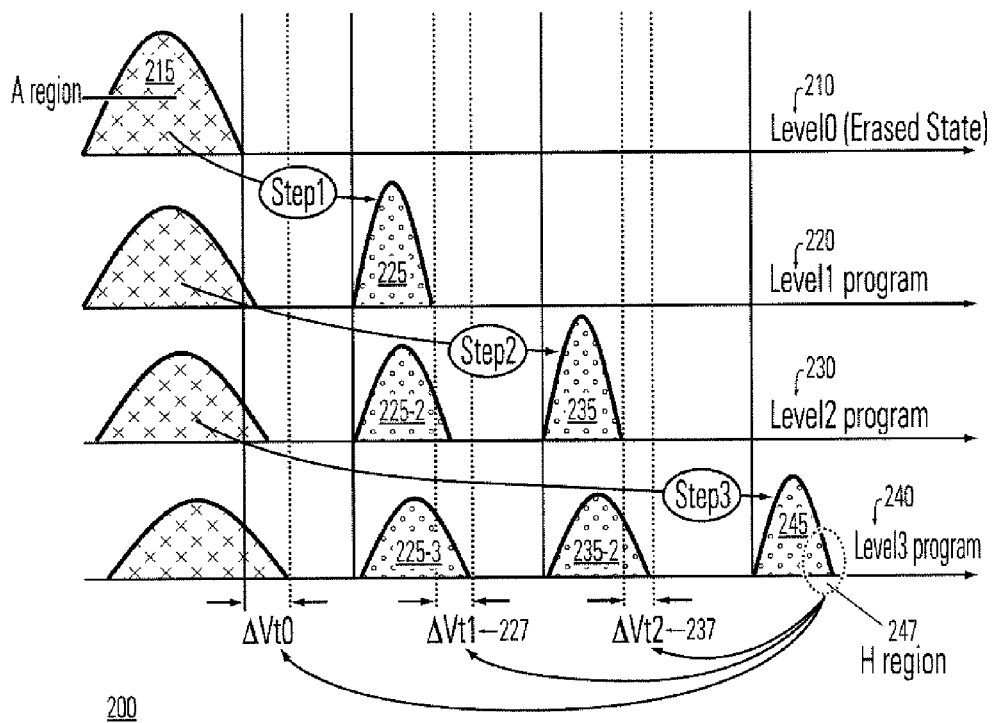
FIG. 2 is a graphical diagram illustrating the sequential programming of different program voltage levels in a nitride trapping memory cell in accordance with the present invention.

The first method also preserves the duration of the read window. The window loss $\Delta Vt2$ 237 in FIG. 2 is eliminated, and the window loss $\Delta Vt1$ 227 in FIG.2 is significantly suppressed, because the first sequence in the first method is to perform the level3 720 programming. As shown in FIG.7, the $\Delta Vt1$ 744 is less than the $\Delta Vt1$ 227 in FIG. 2 because the $\Delta Vt1$ 744 is affected by an H1 region 750 rather than from an H region 752. The shift in the threshold voltage of the parameter $\Delta Vt0$ 742 is also improved because the level3 target is lowered based on the tighter level1, level2 window in the first method.

Figure 8:
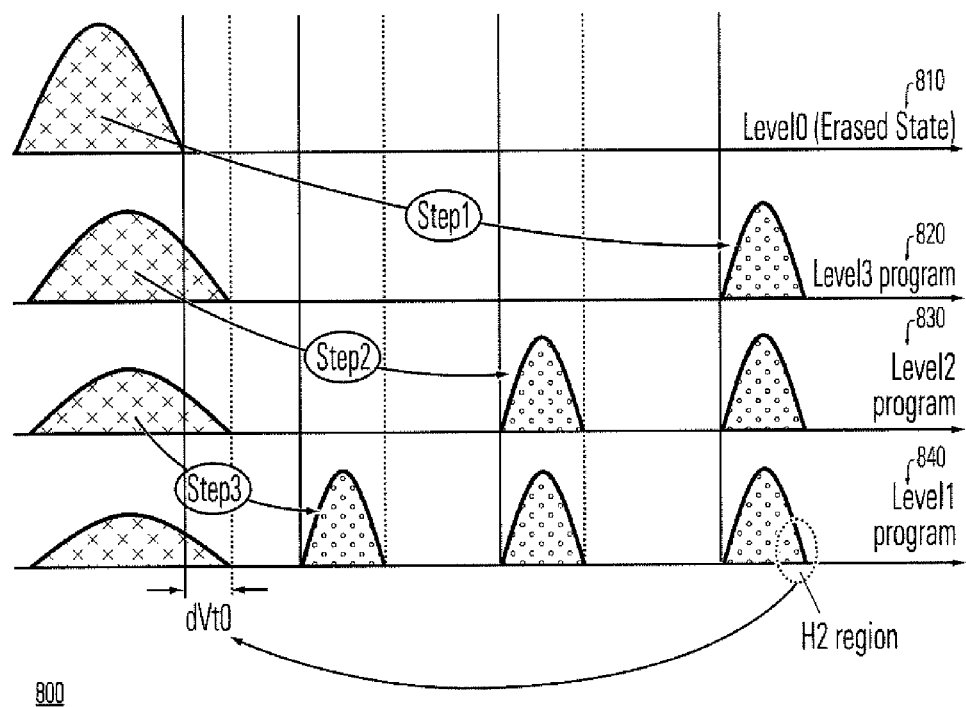
FIG. 8 is a graphical diagram illustrating a second method in a reverse program sequence in order to enhance the multi-level-cell program speed while suppressing the read window loss due to complementary bit disturbance in accordance with the present invention.

FIG. 8 is a graphical diagram 800 illustrating a second method in a reverse programming sequence used to enhance the multi-level-cell programming speed while suppressing the read window loss due to complementary bit disturbance. The second method as shown in graphical diagram 800 adopts a reverse program sequence: (1) programming level3 (2) programming level2, aid (3) programming level1, The second method as shown in graphical diagram 800 reduces or eliminates the small window loss $\Delta Vt1$ in level1.

Initially, the nitride trapping memory cell 500 is erased during operation at level0 810. Rather beginning programming at level1, at step 1, the nitride trapping memory cell 500 is programmed to level3 820. At step 2, the nitride trapping memory cell 500 is programmed to level2 830. At step 3, the nitride trapping memory cell 500 is programmed to level1 840.

In the reverse program sequence of the second method as shown in graphical diagram 800, the undesirable effect of a neighboring bit (a complementary bit) will be programmed to a higher level after completing the programming of a lower level bit program, except the erased bit area which does not need to be programmed. For example, after the level2 830 programming is completed, it is not necessary to be concerned about whether a neighboring bit will be programmed to a higher level (i.e., level3) at a later time, as caused by the complementary bit disturbance, because level3 820 has already been programmed. Therefore, the reverse program sequence in the second method as shown in graphical diagram 800 reduces or eliminates the $\Delta Vt1$ and $\Delta Vt2$ window loss as compare to conventional solutions.

Figure 9:
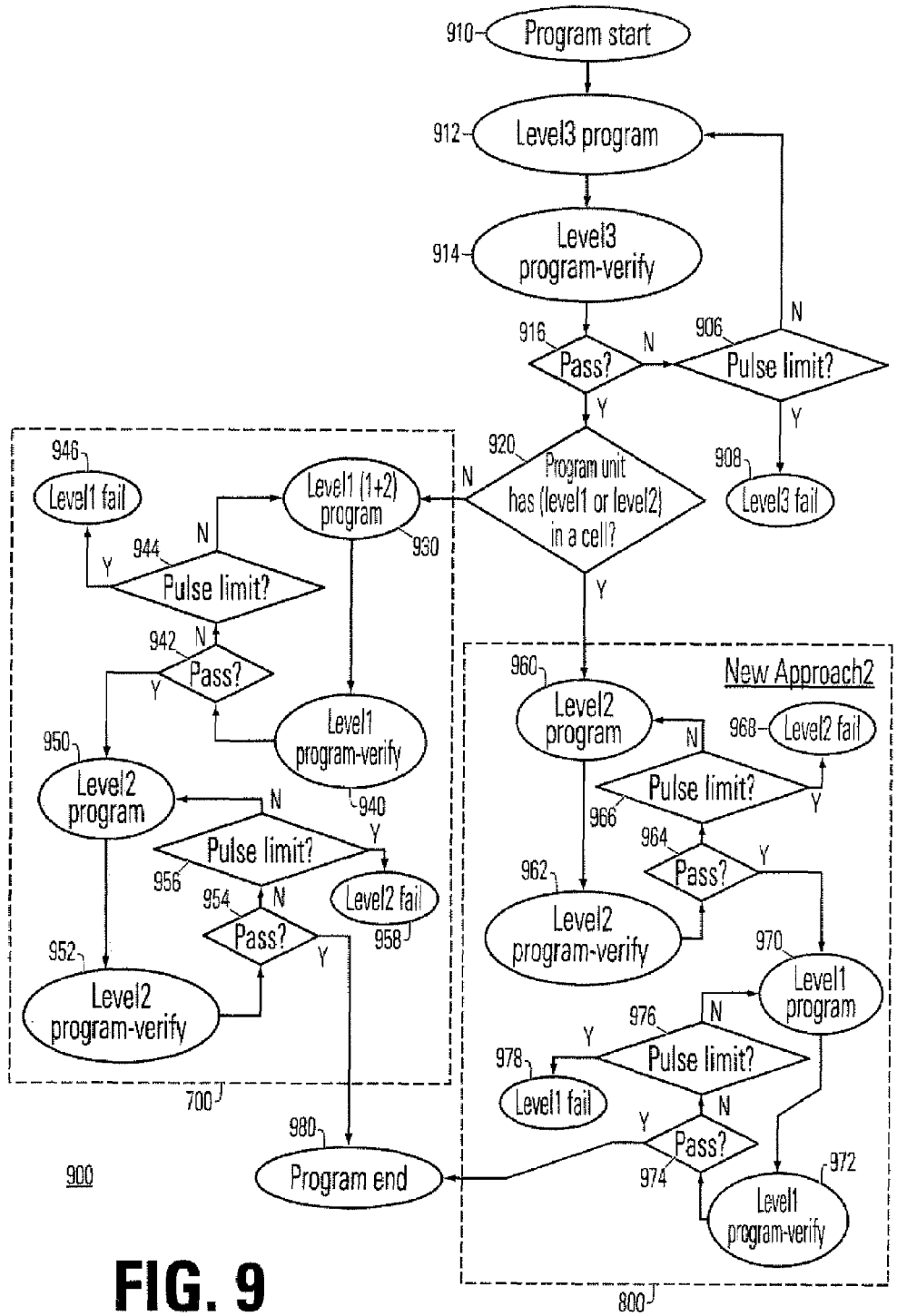
FIG. 9 is a flow diagram illustrating the process of the program flow of the multi-level-cell in the first and second embodiments in accordance with the present invention.

Turning now to FIG. 9, there is shown a flow diagram illustrating the process of the programming flow of the multi-level-cell in a multi-bit-cell in the first and second embodiments. Although the programming methods of the first embodiment in FIG. 7 and the second embodiment in FIG. 8 can be separately implemented, the programming behavior of a memory array encourages the combination of several programming units due to the limited ability of a pump circuit. Generally, if a programming unit has a pattern of level1 or level2 in a multi-level-cell, the flow will follow the method described in the second embodiment; otherwise, the flow will follow the method described in the first embodiment.

At step 910, the programming sequence begins. Since both the first programming method as shown in graphical diagram 700 and the second programming method start with level3 programming, the process 900 conducts a level3 program at step 912. At step 914, the process 900 conducts a level3 program verification check. The result of the verifying step is tested at step 916 to determine whether the level3 verification passes. If the result does not pass, at step 906, the process 900 determines a pulse limit. If the pulse limit has not been reached, the process 900 returns to the step 912 to carry out the level3 programming 912. If the pulse limit has been reached, the process 900 indicates that level3 fails at step 908. However, if the verification passes at step 916, the process 900 proceeds to a program unit and analyzes whether the program unit has a level1 or level2 in a cell in step 920. The term "level1 or level2 in a cell" means that the left side of a cell is level1 while the right side of the same cell is level2 or the left side of a cell is level2 while the right side of the same cell is level1. If the process 900 determines that the program unit does not have level1 or level2 in a cell, the process proceeds to the flow in the first programming method as shown in graphical diagram 700. If the process 900 determines that the program unit does have level1 or level2 in a cell, the process 900 proceeds to the flow in the second method as shown in graphical diagram 800.

In implementing the method in the first embodiment, at step 930, the process 900 conducts level1 (1+2) programming. While programming level1, the "predetermined level2 pattern" to level1 is also programmed at the same time so as to reduce subsequent programming time in level2. When programming level2 at step 950, the process 900 just needs to program the pattern from level1 to level2, rather than from level0 to level2 as taught in a conventional solution.

After the programming of level1 (1+2) at step 930, the process 900 performs a level1 programming verification at step 940. At step 942, the process 900 determines whether the level1 verification test has been passed. If the level1 verification does not pass, the process 900 checks for pulse limit at step 944. If the pulse limit has not been reached, the process 900 returns to step 930. If the pulse limit has been reached, the process 900 indicates that the level1 program failed at step 946. If the level1 verification does pass, the process 900 proceeds to step 950 to perform level2 programming.

After the programming of level2 at step 950, the process 900 performs a level2 program verification at step 952. At step 954, the process 900 determines whether the level2 verification test has been passed. If the verification does not pass, the process 900 checks for a pulse limit at step 956. If the pulse limit has not been reached, the process 900 returns to step 950. If the pulse limit has been reached, the process 900 indicates that the level2 program failed at step 958. If the verification does pass, the process 900 proceeds to end the programming flow at step 980.

In implementing the method in the second embodiment, at step 960, the process 900 performs a level2 programming. The process 900 conducts a level2 program verification at step 962. At step 964, the process 900 checks to determine if the level2 program verification passes. If the verification does not pass, at step 966, the process 900 determines a pulse limit. If the pulse limit has not been reached, the process 900 proceeds to step 960. If the pulse limit has been reached, the process 900 indicates that the level2 programming failed at step 968.

If the program verification passes, the process 900 conducts level1 program at step 970. The process 900 performs a level1 program verification at step 972. At step 974, the process 900 checks if the program verification passes. If the program verification does not pass, at step 976, the process 900 checks a pulse limit. If the pulse limit has not been reached, the process 900 proceeds to step 970. However, if the pulse limit has been reached, the process 900 indicates that level1 failed at step 978. If the program verification passes, the process 900 proceeds to end the programming process at step 980.

Each multi-bit-cell has a left side bit (or bit A 310) and a right side bit (bit B 320), as shown in FIG. 3. The multi-level-cell in the multi-bit-cell creates four bits, bit 1 510 and bit 2 520 on the left side, and bit 3 530 and bit 4 540 on the right side, and four program levels, level0, level1 , level2, and level3 in a single multi-bit-cell. Therefore, sixteen combinations are possible: (level0, level0), (level0, level1), (level0, level2), 25 (level0, level3), (level1, level0), (level1, level1), (level1, level2), (level1, level3), (level2, level0), (level2, level1), (level2, level2), (level2, level3), (level3, level0), (level3, level1), (level3, level2), and (level3, level3).

The method sequence in the programming of the multi-level-cell in a multi-bit-cell nitride trapping material can vary depending on a selected design or implementation. For example, the method sequence may include programming a first bit on the left side, a third bit on the right, and a second bit on the left side. In another example, the method sequence may include programming a third bit on the right side a first bit on the left side, and a fourth bit on the right side.

Figure 10:
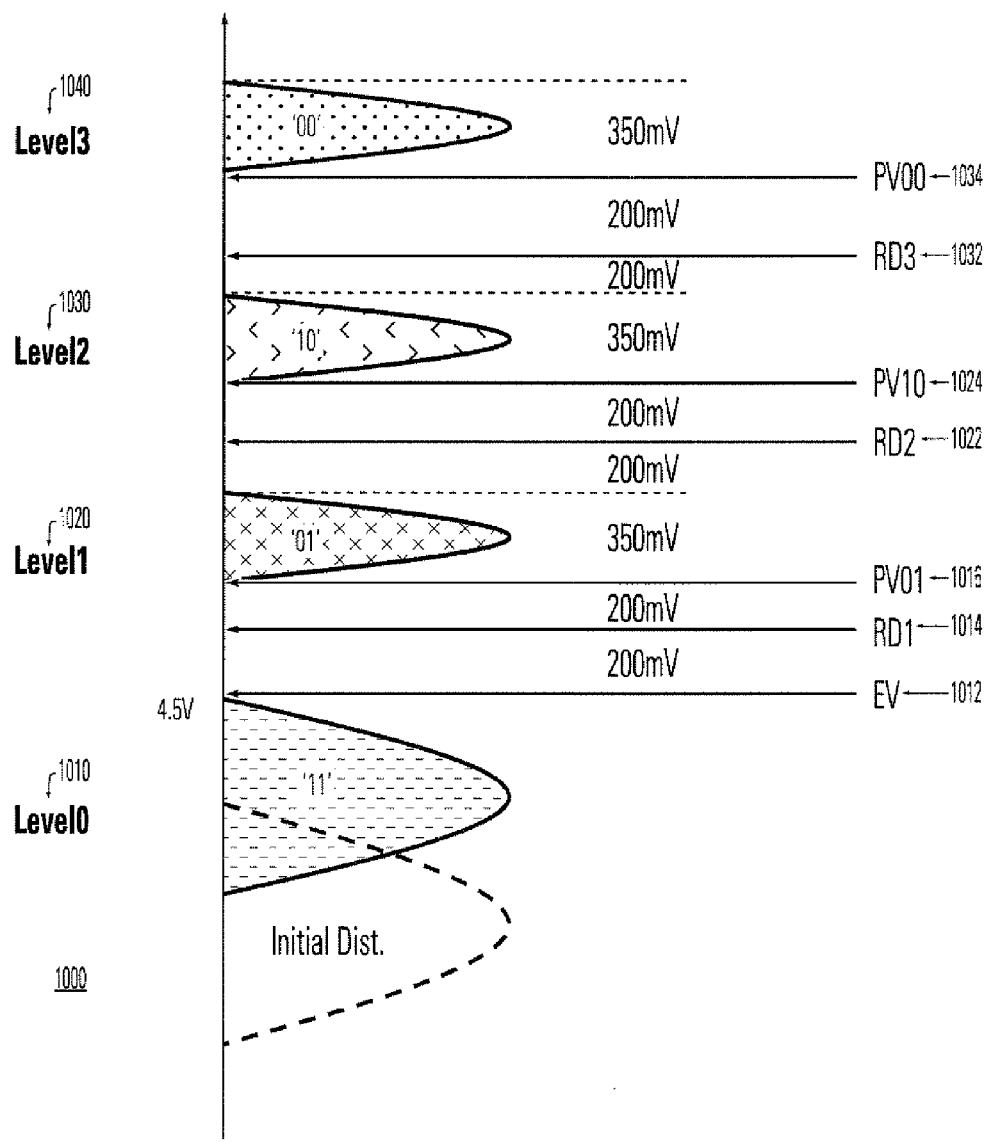
FIG. 10 is a graphical diagram illustrating one embodiment of threshold voltages for the four program levels in accordance with the present invention.

In FIG. 10, there is shown a graphical diagram 1000 illustrating one embodiment of threshold voltages for the four program levels. In one embodiment, the four different levels are encoded as follows: level0=11, level1=01, level2=10, level3=00. One of skill in the art should recognize that other types of encoding or definitions can be practiced without departing from the spirit of the present invention. The four different levels formulate sixteen possible combinations of conditions between the left side of a multi-level-cell and the right side of the multi-level-cell, as shown below in Table 1.

TABLE 1

| (Left Side, Right Side) | Program levels (left side, right side) |
|---|---|
| (Level0, Level0) | (11, 11) |
| (Level0, Level1) | (11, 01) |
| (Level0, Level2) | (11, 10) |
| (Level0, Level3) | (11, 00) |
| (Level1, Level0) | (01, 11) |
| (Level1, Level1) | (01, 01) |
| (Level1, Level2) | (01, 10) |
| (Level1, Level3) | (01, 00) |
| (Level2, Level0) | (10, 11) |
| (Level2, Level1) | (10, 01) |
| (Level2, Level2) | (10, 10) |
| (Level2, Level3) | (10, 00) |
| (Level3, Level0) | (00, 11) |
| (Level3, Level1) | (00, 01) |
| (Level3, Level2) | (00, 10) |
| (Level3, Level3) | (00, 00) |

The level0 1010 program, encoded with a binary value of 11, has a threshold voltage of about 4.5 volts, which is set around an erase verification (EV) voltage level 1012. The level1 1020 program, encoded with a binary value of 01, has a threshold voltage of approximately 4.5 volts+200 mV+200 mV+350 mV. The level2 1030 program, encoded with a binary value of 10, has a threshold voltage of approximately 4.5 volts+200 mV+200 mV+350 mV+200 mV+200 mV+350 mV. The level3 1040 program, encoded with a binary value of 00, has a threshold voltage of approximately 4.5 volts+200 mV+200 mV+350 mV+200 mV+200 mV+350 mV +200 mV+200 mV+350 mV. A first read voltage, RD1 1014, is set in between the level0 1010 voltage and the level1 1020 voltage. A second read voltage, RD2 1022, is set in between the level1 1020 voltage and the level2 1030 voltage. A third read voltage, RD3 1032, is set in-between the level2 1030 voltage and the level3 1040 voltage. A first program verification, PVO1 1016, is set near the lower edge of the level1 1020 program voltage range. A second program verification, PV10 1024, is set near the lower edge of the level2 1030 program voltage range. A third program verification, PV00 1034, is set near the lower edge of the level3 1040 program voltage range.

The invention has been described with reference to specific exemplary embodiments. Memory cell structures based on charge trapping dielectric layers, such as mitride read only memory, that are applicable for implementing a multi-level-cell in a multi-bit-cell include structures known by the industry names SONOS, and PHINES, for example. Although the programming of a multi-level-cell in a multi-bit-cell is described above, the present invention is applicable to page programming or other types of programming of a block, a sector, or a sub-block of MLCs in MBCs in a memory array. Various modifications, adaptations, and changes may be made without departing from the spirit and scope of the invention. Accordingly, the specification and drawings are to be regarded as illustrative of the principles of this invention rather than restrictive, the invention is defined by the following appended claims.

Figure 11:
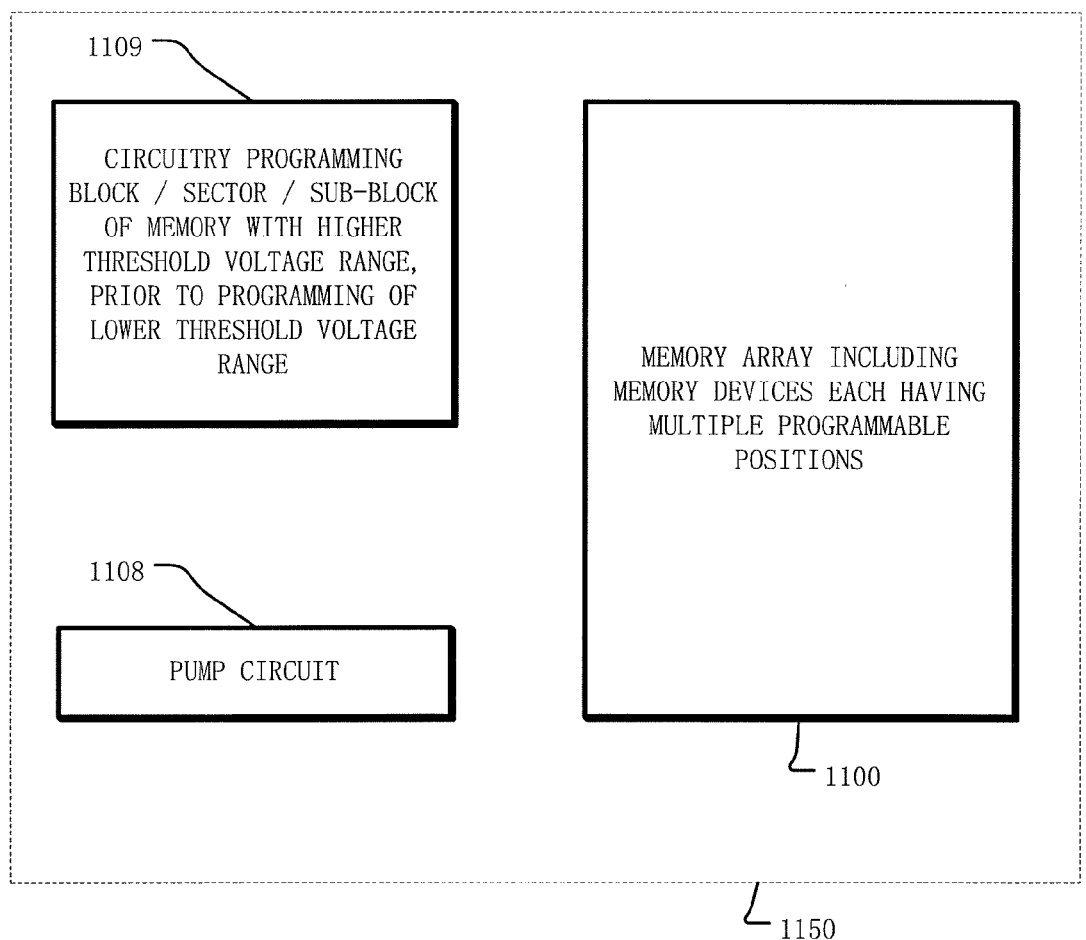
FIG. 11 is a block diagram of a memory array embodiment of the technology.

FIG. 11 is a block diagram of a memory array embodiment of the technology. An integrated circuit 1150 includes a memory array 1100, pump circuit 1108, and programming circuitry 1109. The memory array 1100 includes memory devices each having multiple physical positions that are each programmable. An example memory device is the nitride device shown in FIG. 3A. The programming circuitry 1109 programs multiple memory devices (e.g., block, sector, sub-block) with a higher threshold voltage range prior to a lower threshold voltage range. An example of programming circuitry 1109 is shown in FIG. 9. Pump circuit 1108 supports programming circuitry 1109 in programming the memory array 1100.

We claim:

1. A method for programming memory cells, comprising:
   programming a plurality of data values into a plurality of memory cells, each memory cell of the plurality of memory cells having a plurality of sides, the plurality of sides including at least a first side and a second side, each of the first side and second side storing one of a plurality of nonoverlapping threshold voltage ranges, the plurality of nonoverlapping threshold voltage ranges including at least a first threshold voltage range, a second threshold voltage range, a third threshold voltage range, and a fourth threshold voltage range, wherein the fourth threshold voltage range is higher than the third threshold voltage range, the third threshold voltage range is higher than the second threshold voltage range, and the second threshold voltage range is higher than the first threshold voltage range, such that the plurality of data values is represented by a combination of particular threshold voltage ranges stored by the plurality of sides of the plurality of memory cells, including:
     programming and verifying the plurality of sides of the plurality of memory cells with instances of the fourth threshold voltage range of the combination into; and then
     programming and verifying the plurality of sides of the plurality of memory cells with at least one of: instances of the third threshold voltage range, and instances of the second threshold voltage range.

2. The method of claim 1, wherein said method prevents, programming the first side of a particular memory cell with the fourth threshold voltage range, after programming the second side of the particular memory cell with one of the third threshold voltage range and the second threshold voltage range,
   wherein the fourth threshold voltage range stored by said first side and the said one of the third threshold voltage range and the second threshold voltage range stored by the second side represent data values programmed to the particular memory cell.

3. The method of claim 1, wherein said programming and verifying the plurality of sides of the plurality of memory cells with at least one of: instances of the third threshold voltage range, and instances of the second threshold voltage range, comprises:
     programming and verifying the plurality of sides of the plurality of memory cells with instances of the second threshold voltage range; and then
     programming and verifying the plurality of sides of the plurality of memory cells with instances of the third threshold voltage range.

4. The method of claim 1, wherein said programming and verifying the plurality of sides of the plurality of memory cells with at least one of: instances of the third threshold voltage range, and instances of the second threshold voltage range, comprises:
     programming and verifying the plurality of sides of the plurality of memory cells with instances of the second threshold voltage range; and then
     programming and verifying the plurality of sides of the plurality of memory cells with instances of the third threshold voltage range, wherein the instances of the third threshold voltage range were partly programmed during said programming with instances of the second threshold voltage range.

5. The method of claim 1, wherein said programming and verifying the plurality of sides of the plurality of memory cells with at least one of: instances of the third threshold voltage range, and instances of the second threshold voltage range, comprises:
     programming and verifying the plurality of sides of the plurality of memory cells with instances of the third threshold voltage range; and then
     programming and verifying the plurality of sides of the plurality of memory cells with instances of the second threshold voltage range.

6. The method of claim 1, wherein said programming and verifying the plurality of sides of the plurality of memory cells with at least one of: instances of the third threshold voltage range, and instances of the second threshold voltage range, comprises:
     programming and verifying the plurality of sides of the plurality of memory cells with instances of the third threshold voltage range; and then
     programming and verifying the plurality of sides of the plurality of memory cells with instances of the second threshold voltage range
   wherein said method prevents, programming the first side of a particular memory cell with the third threshold voltage range, after programming the second side of the particular memory cell with the second threshold voltage range,
   wherein the third threshold voltage range stored by said first side and the second threshold voltage range stored by the second side represent data values programmed to the particular memory cell.

7. The method of claim 1, wherein said plurality of memory cells are charge trapping memory cells.

8. The method of claim 1, wherein the plurality of nonoverlapping threshold voltage ranges represents 2 bits.

9. The method of claim 1, wherein the plurality of nonoverlapping threshold voltage ranges represents at least 4 bits.

10. A memory integrated circuit, comprising:
    a memory array; and
    programming circuitry coupled to the memory array, the programming circuitry performing:
      programming a plurality of data values into a plurality of memory cells of the memory array, each memory cell of the plurality of memory cells having a plurality of sides, the plurality of sides including at least a first side and a second side, each of the first side and second side storing one of a plurality of nonoverlapping threshold voltage ranges, the plurality of nonoverlapping threshold voltage ranges including at least a first threshold voltage range, a second threshold voltage range, a third threshold voltage range, and a fourth threshold voltage range, wherein the fourth threshold voltage range is higher than the third threshold voltage range, the third threshold voltage range is higher than the second threshold voltage range, and the second threshold voltage range is higher than the first threshold voltage range, such that the plurality of data values is represented by a combination of particular threshold voltage ranges stored by the plurality of sides of the plurality of memory cells, including:

programming and verifying the plurality of sides of the plurality of memory cells with instances of the fourth threshold voltage range of the combination into; and then programming and verifying the plurality of sides of the plurality of memory cells with at least one of: instances of the third threshold voltage range, and instances of the second threshold voltage range.

11. The circuit of claim 10, wherein said programming circuitry prevents, programming the first side of a particular memory cell with the fourth threshold voltage range, after programming the second side of the particular memory cell with one of the third threshold voltage range and the second threshold voltage range, wherein the fourth threshold voltage range stored by said first side and the said one of the third threshold voltage range and the second threshold voltage range stored by the second side represent data values programmed to the particular memory cell.

12. The circuit of claim 10, wherein said programming circuitry is further limited such that, said programming and verifying the plurality of sides of the plurality of memory cells with at least one of: instances of the third threshold voltage range, and instances of the second threshold voltage range, comprises:

programming and verifying the plurality of sides of the plurality of memory cells with instances of the second threshold voltage range; and then programming and verifying the plurality of sides of the plurality of memory cells with instances of the third threshold voltage range.

13. The circuit of claim 10, wherein said programming circuitry is further limited such that, said programming and verifying the plurality of sides of the plurality of memory cells with at least one of: instances of the third threshold voltage range, and instances of the second threshold voltage range, comprises:

programming and verifying the plurality of sides of the plurality of memory cells with instances of the second threshold voltage range; and then programming and verifying the plurality of sides of the plurality of memory cells with instances of the third threshold voltage range, wherein the instances of the third threshold voltage range were partly programmed during said programming with instances of the second threshold voltage range.

14. The circuit of claim 10, wherein said programming circuitry is further limited such that, said programming and verifying the plurality of sides of the plurality of memory cells with at least one of: instances of the third threshold voltage range, and instances of the second threshold voltage range, comprises:

programming and verifying the plurality of sides of the plurality of memory cells with instances of the third threshold voltage range; and then programming and verifying the plurality of sides of the plurality of memory cells with instances of the second threshold voltage range.

15. The circuit of claim 10, wherein said programming circuitry is further limited such that, said programming and verifying the plurality of sides of the plurality of memory cells with at least one of: instances of the third threshold voltage range, and instances of the second threshold voltage range, comprises:

programming and verifying the plurality of sides of the plurality of memory cells with instances of the third threshold voltage range; and then programming and verifying the plurality of sides of the plurality of memory cells with instances of the second threshold voltage range wherein said method prevents, programming the first side of a particular memory cell with the third threshold voltage range, after programming the second side of the particular memory cell with the second threshold voltage range, wherein the third threshold voltage range stored by said first side and the second threshold voltage range stored by the second side represent data values programmed to the particular memory cell.

16. The circuit of claim 10, wherein said plurality of memory cells are charge trapping memory cells.

17. The circuit of claim 10, wherein the plurality of non-overlapping threshold voltage ranges represents 2 bits.

18. The circuit of claim 10, wherein the plurality of non-overlapping threshold voltage ranges represents at least 4 bits.

* * * * *